United States Patent [19]

Clark et al.

[11] 4,378,258

[45] Mar. 29, 1983

[54] CONVERSION BETWEEN MAGNETIC ENERGY AND MECHANICAL ENERGY

[75] Inventors: Arthur E. Clark; Henry S. Belson, both of Adelphi, Md.

[73] Assignee: The United States of America as represented by the Secretary of the Navy, Washington, D.C.

[21] Appl. No.: 250,450

[22] Filed: Apr. 2, 1981

Related U.S. Application Data

[63] Continuation of Ser. No. 471,640, May 20, 1974, abandoned, which is a continuation-in-part of Ser. No. 235,411, Mar. 16, 1972, abandoned.

[51] Int. Cl.³ .............................................. H01F 1/02
[52] U.S. Cl. ................................ 148/100; 75/123 E; 148/31.57; 148/103; 310/26; 420/435; 420/455; 420/416
[58] Field of Search .................. 148/31.57, 31.55, 100, 148/101, 103, 105, 108, 408, 409, 425, 426; 75/123 E, 84, 152, 170; 340/870.3; 310/26; 73/862.36, 862.69, DIG. 2; 179/110 C, 110 E; 101/DIG. 5; 420/416, 435, 455, 459

[56] References Cited

U.S. PATENT DOCUMENTS

| | | | |
|---|---|---|---|
| 2,829,047 | 4/1958 | Round et al. | 75/170 |
| 2,829,048 | 4/1958 | Cochardt et al. | 75/170 |
| 3,102,002 | 8/1963 | Wallace et al. | 75/152 |
| 3,421,889 | 1/1969 | Ostertag et al. | 75/170 |
| 3,424,578 | 1/1969 | Strnat et al. | 148/103 |
| 3,523,836 | 8/1970 | Buschow et al. | 148/31.57 |
| 3,582,408 | 6/1971 | Onyshkevych | 148/31.55 |

FOREIGN PATENT DOCUMENTS 752317  7/1956  United Kingdom ............ 148/31.57

OTHER PUBLICATIONS

Nesbitt et al, "Mag. Moments of Intermetallic Comp. of Trans. and Rare Earth Elements", J. Applied Phys., 33, May 1962, pp. 1674–1678.

Strnat et al, "Magnetic Properties of Rare–Earth–Iron Intermetallic Compounds", IEEE Trans. on Mag., vol. MAG. 2, No. 3, Sep. 1966, pp. 489–493.

Narasimhan et al, "Magnetic Properties of $RT'_{3-x}Ni_x$ Compounds (R=Dy or Ho, T=Fe or Co), J. Appl. Phys. 44, 1973, pp. 879–882.

Buschow et al, "Perm. Mag. Materials of Re–Co Compound", Zeit. für Physik 26, 1969, pp. 157–160.

*Primary Examiner*—John P. Sheehan
*Attorney, Agent, or Firm*—R. S. Sciascia; A. L. Branning; R. D. Johnson

[57] ABSTRACT

A method of converting magnetic energy to mechanical energy comprising subjecting a material of the formula $R_xT_{1-x}$ wherein R is a rare earth or mixtures thereof, T is Fe, Ni, Co, Mn, or mixtures thereof, and $0 < x < 1$, to a change in magnetic field and of converting mechanical energy to magnetic energy comprising subjecting a material of the formula $R_xT_{1-x}$ to a change in pressure.

18 Claims, No Drawings

CONVERSION BETWEEN MAGNETIC ENERGY AND MECHANICAL ENERGY

CROSS REFERENCE TO RELATED APPLICATIONS

This application is a continuation of application Ser. No. 471,640, filed on May 20, 1974 abandoned which was a continuation-in-part of application Ser. No. 235,411 filed on Mar. 16, 1972 abandoned.

BACKGROUND OF THE INVENTION

This invention generally relates to magnetostrictive materials and more particularly to materials which exhibit relatively large magnetostriction at room temperature.

Most transducers commonly in use today fall into two categories: electrostrictive and magnetostrictive. Among the electrostrictive devices are barium titanate and PZT. Among the magnetostrictive materials are Ni and Al-Fe alloys. Although these magnetostrictive materials have magnetostrictions at room temperature (which is the operating temperature of most transducer devices) which enable them to be used in transducer devices, it has always been desirable to obtain other magnetostrictive materials which have greater magnetostriction then those presently in use.

In 1963, it was discovered by A. E. Clark, R. Bozorth and B. DeSavage, Phys. Letters 5, 100 (1963), that certain heavy rare earth elements have magnetostrictions about 1000 times greater than Fe and about 200 times greater than Ni. However, these enormous magnetostrictions are only present at cryogenic temperatures and are most pronounced in the neighborhood of absolute zero. At room temperature, the rare earth elements have little magnetostriction since their magnetic ordering temperatures fall below room temperature. Therefore, all are far inferior to the hereinbefore referenced materials which are presently in use.

Thus, research has been conducted in an attempt to find materials which have relatively large magnetostriction at temperatures above 250° K. and preferably at about 300° K. (room temperature).

The most attractive transducer materials have high magnetostrictions and low magnetic anisotropies (i.e. they are magnetically soft). In contradistinction, the most attractive rare earth permanent magnet materials (e.g. $SmCo_5$) have high magnetic anisotropies (i.e. they are magnetically hard).

SUMMARY OF THE INVENTION

Accordingly, one object of this invention is to provide magnetostrictive materials.

Another object of this invention is to provide materials which have relatively large magnetostriction compared to materials presently in common use.

Yet another object of this invention is to provide materials which have relatively large magnetostriction at or about room temperature.

Another object of this invention is to provide materials which have relatively large magnetostriction about 250° K.

A still further object of this invention is to provide a method for converting magnetic energy into mechanical energy.

Yet another object of this invention is to provide a method of converting mechanical energy into magnetic energy.

These and other objects of this invention are accomplished by providing materials of the formula $R_xT_{1-x}$ wherein R is a rare earth selected from the group consisting of Ce, Pr, Nd, Sm, Gd, Tb, Dy, Ho, Er, Tm, Yb and mixtures thereof, T is a transition metal selected from the group consisting of Fe, Co, Ni, Mn and mixtures thereof, x represents atomic fraction and is greater than 0 but less than 1 ($0<x<1$), which have relatively large magnetostriction above 250° K. as well as at about room temperature.

DESCRIPTION OF THE PREFERRED EMBODIMENT

The materials which exhibit relatively large magnetostriction are represented by the general formula $R_xT_{1-x}$ wherein R is Ce, Pr, Nd, Sm, Gd, Tb, Dy, Ho, Er, Tm, Yb or mixtures thereof, T is Fe, Co, Ni, Mn, or mixtures thereof, x represents atomic fraction and can have any value greater than 0 but less than 1 ($0<x<1$). When magnetostrictive materials are subjected to a change in a magnetic field, they will change their dimensions so that magnetic energy is converted to mechanical energy. Likewise, these materials, when subjected to a change in pressure, will convert mechanical energy to magnetic energy. It is to be understood that, within the terms of this invention, "mechanical energy" is defined as physical movement of matter. Thus, when a material exhibits magnetostriction, magnetic energy is converted to mechanical energy and/or mechanical energy is converted to magnetic energy.

It should be noted that in the overwhelming majority of situations where magnetostrictive materials are used for their magnetostrictive property, the change in magnetic field is actually generated by the flow of an electric current so that one is actually converting electrical energy into mechanical energy via magnetic energy. However, the change of magnetic field, whether the source of it be an electric current or another magnetic material, is what actually causes the magnetostriction.

The measurement of magnetostriction is given by the formula $\Delta l/l$ wherein $\Delta l$ is the change in length of the magnetostrictive material due to the change of the magnetic field and l is the original length. For convenience, the quantity of magnetostriction is given in parts per million.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLES 1-17

Some typical binary materials which have been prepared and their maximum magnetostriction at room temperature are given below in Table I along with a typical magnetostrictive material, Ni.

TABLE I

| Material | Magnetostriction (in units of $10^{-6}$) |
|---|---|
| Ni | −55 |
| $TbFe_2$ | 2630 |
| $DyFe_2$ | 591 |
| $ErFe_2$ | −344 |
| $SmFe_2$ | −880 |
| $PrFe_2$ | 60 |

TABLE I-continued

| Material | Magnetostriction (in units of $10^{-6}$) |
|---|---|
| $TmFe_2$ | −190 |
| 85 wt % Tb - 15 wt % Fe | 808 |
| 70 wt % Tb - 30 wt % Fe | 2380 |
| $TbFe_3$ | 1040 |
| $Tb_2Fe_{17}$ | 197 |
| 9 wt % Tb - 91 wt % Fe | 16 |
| $Tb_2Co_{17}$ | 72 |
| $TbCo_5$ | 129 |
| $TbCo_3$ | 97 |
| $Er_{.03}Ni_{.97}$ | −50 |
| $Er_{.05}Ni_{.95}$ | −34 |
| $Tb_2Ni_{17}$ | −6 |

The compounds in table I were prepared by the arc casting of the powdered metals. In addition, the $TbFe_2$ and $DyFe_2$ products were heated at 1000° C. in an argon atmosphere for one week (7 days).

The magnetostrictions in Examples 1–17 represent changes in length as a magnetic field at 25 kOe. is rotated from parallel to the measurement direction to perpendicular to the measurement direction. All the materials of the binary system are either true chemical compounds or alloys as opposed to merely being physical mixtures which will hereinafter be more fully discussed.

In the binary systems wherein only one rare earth element and one transition metal element is present, the preferred rare earth elements are Pr, Sm, Tb, Dy, Er, and Tm with the most preferred being Tb, Sm, and Er. In these systems, the preferred value of x is 0.1 to 0.5. The most preferred transition metal in the binary system is Fe. Thus, the most preferred binary systems are $Tb_xFe_{1-x}$, $Sm_xFe_{1-x}$, and $Er_xFe_{1-x}$ wherein x is 0.1–0.5.

It should be noted, however, that in practical terms, the particular material which has the greatest magnetostriction may not be the one desired for use in a particular article because it has poor secondary characteristics. Thus, if the magnetostrictive material is to be used in a transducer, in many cases it should be strong, it should resist corrosion, eddy current loss should be kept to a minimum, magnetic anisotropy should be low, etc. In order to achieve the best results in actual operation, it may be necessary to use materials which have somewhat poorer magnetostriction but which do possess better secondary properties. For example, a magnetostrictive material having the compositions $TbFe_2$ (58.7 wt % Tb–41.3 wt % Fe) has a magnetostriction of $2630 \times 10^{-6}$ while a magnetostrictive material having the composition 70 wt % Tb–30 wt % Fe has a magnetostriction of $2380 \times 10^{-6}$. However, samples of the $TbFe_2$ broke when dropped on the floor while samples of the 70 wt % Tb–30 wt % Fe material remained intact when dropped on the floor. Thus, increasing the weight percent of Tb provides a stronger material having a smaller magnetostriction. In general, for binary rare earth-iron magnetostrictive materials increasing the atomic fraction of rare earth over $\frac{1}{3}$ decreases the magnetostriction but increases the strength of the material. In summary, one must often sacrifice magnetostriction in order to gain other benefits.

There are a number of other ways by which the secondary properties of the binary materials can be changed which may yield articles which have somewhat poorer magnetostriction and which have better secondary properties.

One of the easiest ways is to modify the binary materials by using more than one rare earth element and one or more than one transition metal at a time. Thus, one can prepare materials of the hereinbefore noted general formula $R_xT_{1-x}$ wherein R is selected from the group consisting of Ce, Pr, Nd, Sm, Gd, Tb, Dy, Ho, Er, Tm, Yb and mixtures thereof and T is selected from the group consisting of Fe, Ni, Co, Mn and mixtures thereof. The preferred rare earth elements are Pr, Sm, Tb, Dy, Er, and Tm with Tb, Sm, and Er being the most preferred. In the multicomponent systems, the tertiary and quarternary systems are preferred because they are the simplest. Furthermore, in systems which have more than two components, it is preferred to have Tb, Sm, and Er constitute 0.1–0.5 atomic fraction of the magnetostrictive material. It is also preferred to have Fe present as the only transition metal or as one of the transition metals present if more than one is present and to have Fe constitute 0.5–0.9 atomic fraction of the magnetostrictive material.

EXAMPLES 18–33

The following ternary compounds have been prepared:

TABLE II

| Material | Magnetostriction (in units of $10^{-6}$) |
|---|---|
| $Tb_{.9}Dy_{.1}Fe_2$ | |
| $Tb_{.8}Dy_{.2}Fe_2$ | 1997 |
| $Tb_{.7}Dy_{.3}Fe_2$ | 1634 |
| $Tb_{.6}Dy_{.4}Fe_2$ | |
| $Tb_{.5}Dy_{.5}Fe_2$ | |
| $Tb_{.4}Dy_{.6}Fe_2$ | 1478 |
| $Tb_{.3}Dy_{.7}Fe_2$ (heat treated) | 1605 |
| $Tb_{.27}Dy_{.73}Fe_2$ (heat treated) | 1590 |
| $Tb_{.25}Dy_{.75}Fe_2$ (heat treated) | 1600 |
| $Tb_{.2}Dy_{.8}Fe_2$ | 1105 |
| $Tb_{.1}Dy_{.9}Fe_2$ | |
| 9 wt % Tb, 21 wt % Dy, 70 wt % Fe | 1160 |
| $TbFe_{1.6}Co_{.4}$ | 1491 |
| $TbFe_{1.6}Ni_{.4}$ | 1095 |
| $TbFe_{1.6}Mn_{.4}$ | |
| $Gd_{.3}Tb_{.7}Fe_2$ | 1267 |

The compounds of table II were prepared by the arc casting of the powdered metals. In addition, the $Tb_{.3}Dy_{.7}Fe_2$, $Tb_{.27}Dy_{.73}Fe_2$, and $Tb_{.25}Dy_{.75}Fe_2$ compounds were heated at 1000° C. in an argon atmosphere for one week (7 days).

Another method of modifying the basic magnetostrictive materials of the formula $R_xT_{1-x}$ is to combine these materials with non-metallic materials such as, for example, resins which are later cured to a solid. This has been found to be a particularly good way of reducing eddy current loss. Epoxy resins have been found to be particularly useful in this respect.

EXAMPLE 34

Four grams of $ErFe_2$ were ground into a powder and mixed with an equal volume of an epoxy resin, EPON-815 with curing agent diethyltriamine (DTA). The resin was cured at about 120° F. for 24 hours. The resulting article had a magnetostriction of $-170 \times 10^{-6}$ at room temperature.

EXAMPLE 35

Four parts of $ErFe_2$ by weight were ground into a powder and mixed with 1 part of an epoxy resin, Scotchcast 18, manufactured by 3M Company. The mixture was cured at about 120° F. for 24 hours.

EXAMPLE 36

TbFe$_2$ was ground into a powder and mixed with an equal volume of an epoxy resin, EPON-815 with curing agent diethyltriamine (DTA). The mixture was cured by allowing to stand at room temperature for 24 hours. Curing was also affected in a magnetic field in order to align the powder. The magnetostriction of the resultant article at room temperature was $1777 \times 10^{-6}$.

In preparing articles wherein materials of the formula $R_x T_{1-x}$ are combined with resins and other potting materials, it is preferred to have the magnetostrictive material constitute 20-60 percent by volume of the mixture since, in this range, good magnetostrictive properties and good secondary properties are obtained.

Another method of modifying the basic material of the formula $R_x T_{1-x}$ is to suspend this material ($R_x T_{1-x}$) into one of the transition metals such as Fe, Co, Ni, Mn, or mixtures thereof to create a physical mixture. Thus, rather than form a true alloy of the material of the formula $R_x T_{1-x}$ and the transition metal, which may be the same as the transition metal of the magnetostrictive material, one suspends the magnetostrictive material in the transition metal.

A typical procedure is to powder the constituent materials, mix the powders, press them into a powder of the desired shape, and sinter.

EXAMPLE 37

Forty wt. % ErFe$_2$ and 60 wt. % Ni were pressed to form a pellet. This pellet was then sintered at 1000° C. for 5 hours. The room temperature magnetostriction of this article was $-77 \times 10^{-6}$.

EXAMPLE 38

Powders of TbFe$_2$ and Fe were mixed and pressed to form a pellet. The weight ratio of TbFe$_2$ to Fe was 40-60. The pellet was sintered at about 950° C. for about 5 hours. The room temperature magnetostriction of this article was $350 \times 10^{-6}$.

In preparing articles wherein materials of the formula $R_x T_{1-x}$ are mixed with transition metals, it is preferred that the magnetostrictive material of the formula $R_x T_{1-x}$ constitute about 20-70 weight percent.

Another method of dispersing rare earth into transition metals is by a rapid sputtering process. The product obtained in this manner comprises a near atomic mixing of the materials wherein the rare earth is atomically suspended in the transition metal.

EXAMPLE 39

1 wt % Dy and 99 wt % Ni were mixed and sputtered on a copper substrate until a thickness of about 0.040 in. was reached. The magnetostriction at room temperature was $-39 \times 10^{-6}$.

EXAMPLE 40

The above experiment was repeated using 10 wt % Dy and 90 wt % Ni.

EXAMPLE 41

33 atomic percent Tb and 67 atomic percent Fe were mixed and sputtered on a copper substrate until a thickness of about 0.040 in. was reached. The magnetostriction at room temperature was $462 \times 10^{-6}$.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A method of converting magnetic energy into mechanical energy wherein said mechanical energy is in the form of a change of dimension in material comprising subjecting a material of the formula $R_x Fe_{1-x}$ wherein R is a rare earth selected from the group consisting of Sm and Tb, and $0 < x < 1$, to a change in magnetic field.

2. The method of claim 1 wherein $0.1 \leq x \leq 0.5$.

3. The method of claim 2 wherein $X = \frac{1}{3}$.

4. The method of claim 1, 2, or 3 wherein R is Tb.

5. The method of claim 1, 2, or 3 wherein R is Sm.

6. A method of converting mechanical energy to magnetic energy comprising subjecting a material of the formula $R_x Fe_{1-x}$ wherein R is a rare earth selected from the group consisting of Sm and Tb and $0 < x < 1$, to a change in pressure.

7. The method of claim 6 wherein $0.1 \leq x \leq 0.5$.

8. The method of claim 7 wherein $X = \frac{1}{3}$.

9. The method of claim 6, 7, or 8 wherein R is Tb.

10. The method of claim 6, 7, or 8 wherein R is Sm.

11. A method of converting magnetic energy into mechanical energy wherein said mechanical is in the form of a change of dimension in material comprising subjecting a material selected from the group consisting of (a) TbFe$_{2-y}$Co$_y$, (b) TbFe$_{2-y}$Ni$_y$, and (c) TbFe$_{2-y}$Mn$_y$ wherein $0 < y \leq 0.4$ to a change in magnetic field.

12. The method of claim 11 wherein the material is TbFe$_{2-y}$Co$_y$ and $0 < y \leq 0.4$.

13. The method of claim 11 wherein the material is TbFe$_{2-y}$Ni$_y$ and $0 < y \leq 0.4$.

14. The method of claim 11 wherein the material is TbFe$_{2-y}$Mn$_y$ and $0 < y \leq 0.4$.

15. A method of converting mechanical energy into magnetic energy comprising subjecting a material selected from the group consisting of (a) TbFe$_{2-y}$Co$_y$, (b) TbFe$_{2-y}$Ni$_y$, and (c) TbFe$_{2-y}$Mn$_y$ wherein $0 < y \leq 0.4$ to a change in pressure.

16. The method of claim 15 wherein the material is TbFe$_{2-y}$Co$_y$ and $0 < y \leq 0.4$.

17. The method of claim 15 wherein the material is TbFe$_{2-y}$Ni$_y$ and $0 < y \leq 0.4$.

18. The method of claim 15 wherein the material is TbFe$_{2-y}$Mn$_y$ and $0 < y \leq 0.4$.

* * * * *